United States Patent
Maher

(10) Patent No.: US 7,378,886 B2
(45) Date of Patent: May 27, 2008

(54) VOLTAGE DETECTION CIRCUIT WITH HYSTERESIS FOR LOW POWER, PORTABLE PRODUCTS

(76) Inventor: Gregory A. Maher, 171 Highland Ave., South Portland, ME (US) 04106

( * ) Notice: Subject to any disclaimer, the term of this patent is extended or adjusted under 35 U.S.C. 154(b) by 86 days.

(21) Appl. No.: 10/965,300

(22) Filed: Oct. 14, 2004

(65) Prior Publication Data

US 2006/0082393 A1  Apr. 20, 2006

(51) Int. Cl.
  *H03L 7/00* (2006.01)
(52) U.S. Cl. ........................ 327/143; 327/198
(58) Field of Classification Search ................ 327/143, 327/198, 142
  See application file for complete search history.

(56) References Cited

U.S. PATENT DOCUMENTS

| | | | | |
|---|---|---|---|---|
| 4,788,454 A | * | 11/1988 | Tanagawa et al. | 327/142 |
| 5,734,280 A | * | 3/1998 | Sato | 327/143 |
| 5,864,247 A | * | 1/1999 | Hirano et al. | 327/143 |
| 6,353,355 B2 | * | 3/2002 | Kato | 327/535 |
| 6,483,357 B2 | * | 11/2002 | Kato et al. | 327/143 |
| 6,731,143 B2 | * | 5/2004 | Kim | 327/143 |
| 6,750,683 B2 | | 6/2004 | McClure et al. | |
| 6,759,852 B1 | | 7/2004 | Samad | |
| 6,809,565 B2 | * | 10/2004 | Kawakubo | 327/143 |
| 6,822,493 B2 | * | 11/2004 | Hirano et al. | 327/143 |
| 6,873,192 B2 | * | 3/2005 | Kang et al. | 327/143 |
| 2002/0145455 A1 | * | 10/2002 | Wang | 327/143 |

* cited by examiner

*Primary Examiner*—N. Drew Richards
*Assistant Examiner*—Thomas J Hiltunen
(74) *Attorney, Agent, or Firm*—Edwin H. Paul

(57) ABSTRACT

A supply voltage level detection circuit makes use of an additional supply already provided for power. A voltage detection circuit defines a first threshold, and a differencing circuit defines a second threshold. The output state of the differencing circuit is saved in a latch. The latch may be cross coupled gates of cross coupled inverters. When inverters are used, the differencing circuit output contends with the internal latch drive when setting or resetting the latch. The design allows the differencing circuit to overcome the inverter's internal drives to change the logic state of the latch.

11 Claims, 2 Drawing Sheets

VOLTAGE DETECTION CIRCUIT WITH HYSTERESIS FOR LOW POWER, PORTABLE PRODUCTS

BACKGROUND OF THE INVENTION

1. Field of the Invention

The present invention relates to monitoring voltages, and more particularly to monitoring power supply voltage levels in low power, portable products.

2. Background Information

Monitoring power supply voltage levels to ensure proper operating voltage levels is becoming more important as integrated circuit power dissipation levels decrease forcing power supply levels and current draws to decrease. Tighter operating supply voltage levels for ensuring sufficient supply voltages are required, and detecting when a supply voltage is within or without acceptable limits becomes more demanding.

There have been a number of recent patents addressing this issue. One such patent is U.S. Pat. No. 6,750,683 to McClure et al., owned by STMicroelectronics, Inc. and entitled "Power Supply Detection Circuitry and Method." This invention includes a feedback connection that provides a hysteresis to prevent oscillations. The invention uses a band-gap as a reference level for comparing the rising and falling power supply voltage level.

Another patent is U.S. Pat. No. 6,759,852 to Samad, owned by Xilinx, Inc. and entitled, "$V_{DD}$ Detection Path in Power-up Circuit." FIG. 1 illustrates this particular invention. Q1 is a p-type CMOS device that is fabricated with a threshold of about 430 mV. The resistor R1 and the threshold of Q2 and the resistor R2 are fabricated to trigger a Schmitt trigger at a value T1, when Vdd reaches a proper level. When this occurs, EN signals the circuitry 10 powered by $V_{DD}$ to begin operation. As $V_{DD}$ decreases, the level into the Schmitt trigger decreases until a value T2 is reached (T2<T1) whereupon the EN is made false (low) and the circuitry is informed that the power supply is too low. It is assumed the circuitry 10 would take suitable steps in such a condition.

The prior art circuits require special devices, like band-gaps, which are often not power efficient over the required range of operating conditions. Also, since the prior art circuits are powered by the power source being monitored, the inter-dependence leads to inadequate noise margins along with power inefficiencies over the typical operating conditions for the circuits.

The prior art did not realize that portable, low power devices that often receive an additional power supply from the cable interface to which they are attached or through an antenna (as in RFID, radio frequency identification, devices). These particular devices dissipate less than 100 microwatts and are often attached via USB (universal serial bus) ports. In such applications, low power operation, power efficiency and adequate noise margins are important for reliable operation. The present invention is directed to these devices, but may find advantageous use with other circuits and systems.

SUMMARY OF THE INVENTION

The present power supply voltage level detection circuit overcomes limitations while providing advantages over the prior art. The present invention makes use of an additional supply that is usually available to low power, portable devices.

The power supply voltage being monitored for voltage levels is input to a voltage detection circuit designed to react to a first threshold. The output of the voltage detection circuit and the power supply being monitored are input to a difference input circuit designed to react to a second higher threshold. The outputs of the difference input circuit are latched holding the state of the difference input circuit. The latch output or outputs are fed to a circuit being powered by the supply voltage being monitored and is used by the circuit being powered to indicate when it may operate and to indicate when it should enter a power down mode and safely shut down.

In one embodiment the voltage detection circuit is a single CMOS FET (field effect transistor), and the difference input circuit has two CMOS FET's. The current supplied to these various transistors may be used to determine thresholds or different thresholds may be built into the devices, or a combination of these techniques may be used to advantage.

In another embodiment, the latch may be cross coupled NAND gates with separate inputs and outputs. In another embodiment the latch may be cross coupled inverters with shared inputs and outputs.

Using cross coupled inverters, the drives from the difference input circuit and the internal drive of the inverters will be in contention when setting and resetting the latch. The drives of these contending sources are designed so that the difference input circuit outputs over comes the latch internal drive to set and reset the latch.

The present invention provides a method for detecting voltage level sufficiency of a power supply and communicating that sufficiency or insufficiency in a reliable manner to a circuit being powered by the power supply. A power on reset signal (POR) is typically provided that eliminates the need for translation into control circuitry.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
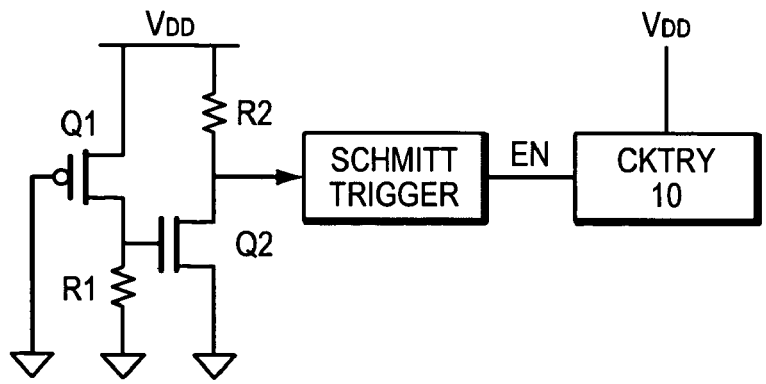
FIG. 1 is a prior art circuit schematic.
Figure 2A:
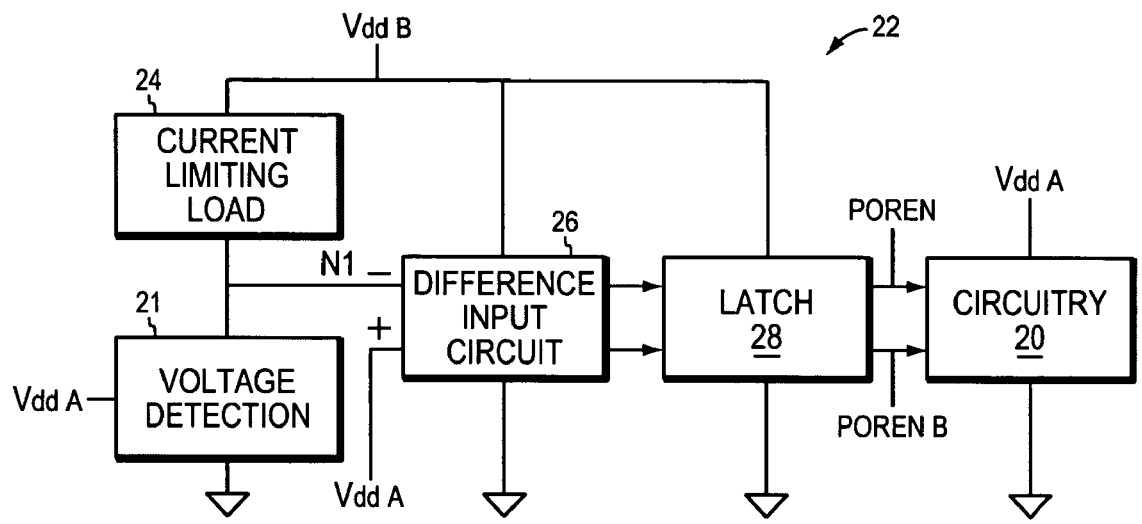
FIG. 2A is a system block diagram embodying the present invention.

FIG. 2A is a block diagram of a supply voltage detection circuit where VddB is a supply voltage that is assumed constant (the additional power supply mentioned above) and that powers the inventive circuitry 22. VddA is the power supply voltage that is being monitored as it rises and falls.

As VddA rises beyond a threshold, a power on reset or enable (POREN) is transmitted to the portable, low power circuitry 20 indicating VddA is high enough to begin operation. When VddA falls lower than another lower threshold the POREN goes false indicating that VddA is falling too low for reliable operation.

Figure 2B:
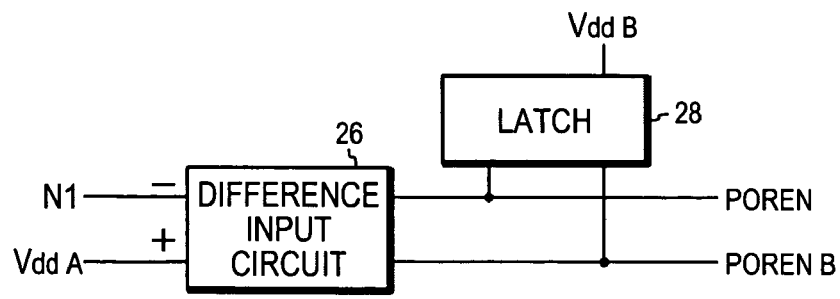
FIG. 2B is another block diagram embodying the present invention.

Still referring to FIG. 2A, both positive and inverse logic power on enable signals may be found useful in practical applications. In FIG. 2, these are shown as POREN high (true) when VddA reaches a suitable level for operating the circuitry 20, and PORENB high true when VddA is not at a level suitable for operating the circuitry 20. These signals are used by the circuitry 20 to begin operation with proper power supply levels and to end operations in a timely manner and safely power down.

Note that the power for the inventive circuitry 22 is drawn from VddB and is independent of VddA. In such an instance, the circuitry 22 can be designed as power efficient with a built in hysteresis for noise rejection, both of which are advantageously independent of the VddA supply.

Referring still to FIG. 2A, when power is turned on VddA, and the latch 28 output POREN is low. VddA rises reaching a low threshold designed into the voltage detection circuit 21. The voltage detection circuit 21 conducts drawing current via the current limiting load 24. The current limiting circuit is designed so that the node N1 traverses from high to low in a controlled response to the rising VddA. The current limiting load may be a resistor or an active device configured to provide a given current to the voltage detection circuit.

With N1 low at the −input of the difference input circuit, VddA at the +input continues to rise to a high threshold where the difference circuit outputs a signal that changes the latch 28 and POREN goes high (and PORENB goes low) and is transmitted to the circuitry 20.

As VddA falls, the high threshold is reached at the +input to the difference circuit 26. The difference circuit 26 and the latch are designed so that the latch state is un-changed when VddA falls past the high threshold. VddA will continue to fall until the low threshold is reached whereupon the voltage detections circuit 21 will allow N1 to rise. N1 will rise activating the difference circuit and driving the latch to change its state back where POREN is low. The difference between the high and the low thresholds is the hysteresis built into the circuit 22.

FIG. 2A illustrates another embodiment of the latching circuit of FIG. 2A. In this implementation the latch inputs also serves as its outputs. When the difference input circuit 26 tries to change the state of the latch 28, the internal latching mechanism and the difference input circuit 26 are in contention with each other. The circuits are designed so that the difference circuit will overcome the latch as described below.

In the present invention the low and the high thresholds may be implemented is several ways as discussed below. In one embodiment the thresholds are designed into the specific components themselves. In another embodiment the thresholds result from different controlled operating conditions of similarly designed components.

Figure 3:
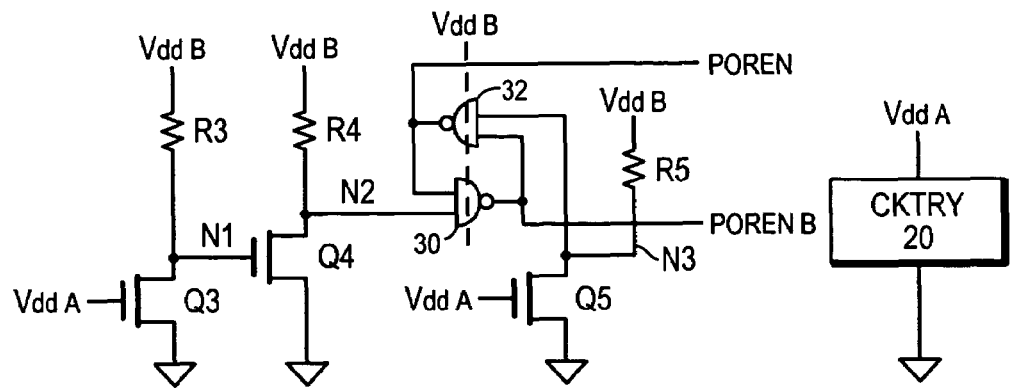
FIG. 3 is a circuit schematic of an embodiment of the present invention.

FIG. 3 is a circuit implementing the block diagram in FIG. 2A. When VddA is low, Q3 and Q5 are off, Q4 is on, node N1 is high, node N2 is low, node N3 is high, and POREN is low (false) and PORENB is high (true). The cross coupled gates 30 and 32 latch this state, and the circuitry 20 is un-powered. Note that the latch is composed of cross coupled, two input NAND gates, 30 and 32. The low at node N2 drives PORENB high and this high along with N3 being high into gate 32 drives POREN low which is coupled into the second input of gate 30 thereby holding the latch in that state. By inspection the power consumed by the circuitry 22 is limited by the resistors and the load of the gates 30 and 32.

Still referring to FIG. 3, as VddA rises to the threshold of Q3, it will begin to conduct thereby lowering the voltage at N1, the gate of Q4. Q4 will turn off allowing N2 to rise, but this will not change the state of the latch. VddA continues to rise until the threshold of Q5 is reached whereupon Q5 drives N3 low and this changes the state of the latch and POREN goes high and PORENB goes low. In this state the latch can only be reset via N2. When VddA falls it reaches the threshold of Q5 which turns off allowing N3 to rise, but this does not change the state of the latch since PORENB remains low holding the latch. However, VddA continues to fall reaching the threshold of Q3 which turns off allowing N1 to rise. N1 turns on Q4 which drives N2 low resetting the latch. The difference between the threshold of Q5 and that of Q3 determines the hysteresis of the circuit.

In the above description the different thresholds may be built into Q3 and Q5, or the operating drain current of Q3 and Q5 as determined by R3 and R5, respectively, may be made so the transistors are in "weak conduction" modes that effectively change the effective thresholds of Q5 with respect to Q3.

Figure 4:
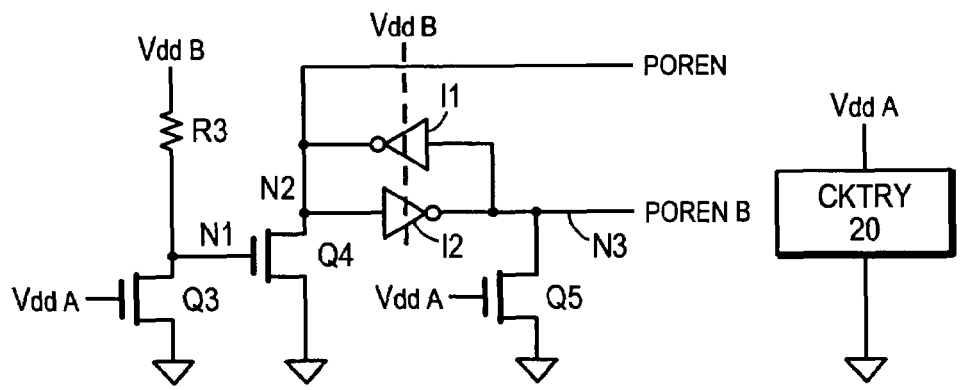
FIG. 4 is another circuit schematic of another embodiment of the present invention.

FIG. 4 is similar to FIG. 3 except the latch is cross coupled inverters, no pull up resistors, and where two latch outputs are also the latch's inputs. The transistors Q4 and Q5 are designed, when they are on, to overcome the inverter outputs. In this circuit the operation is similar to that of FIG. 3, except when Q4 goes low it overcomes the high drive of I1, and when Q5 drives low it overcomes the high drive of I2.

With respect to FIG. 4 another embodiment of the present invention can be described where the threshold of Q3 and Q5 are equal to each other, as mentioned above. In this embodiment, the current load of Q3 is determined by R3, while the current load on Q5 is determined by the input of inverter I1 and the output of inverter I2. There will be contention between Q5 driving N3 low while I2 drives N3 high. In this preferred embodiment, the current loads on Q3 and Q5 are designed so that Q3 will drive N1 low while Q5 cannot drive N3 low due to the contention of I2. VddA must go higher to more fully drive Q5 on to overcome the contention of the latch. This establishes the higher threshold. The lower threshold is determined by Q3 turning off allowing N1 to rise enough to turn on Q4 enough to overcome the latch contention and reset the latch.

Still referring to FIG. 4, the input voltage level threshold that resets the latch as VddA falls can be set by forming the resistor R3 and the conducting characteristics of Q3 and Q4 so that the threshold is lower than the rising voltage threshold determined by Q5. The difference is the hysteresis that ensures noise protection, and, due to powering of the inventive circuit from a second power supply, the hysteresis can be maintained over temperature and power supply voltage levels better than could the prior art circuits. In a preferred embodiment at typical conditions only about two microamps are drawn from VddB.

In one preferred embodiment, with VddB at +3.3 V and the temperature at 25° C. the rising threshold of Q3 and Q5 is arranged to be at about IV and the falling threshold of both is arranged to be about 0.6V. The hysteresis is about 0.4V and the current drawn from VddB is about 2.2 uA.

Operation of the above preferred embodiment from temperatures from −40 to +90 and at VddB voltages from +2.7V to +3.6 volts demonstrated rising threshold from about 0.9V to 1.2V and falling thresholds from 0.7V to 0.5V. Resultant hysteresis over these ranges varied from about 0.530 mV to 0.300 mV, and current draw from VddB varied from about 1.0 uA to about 3.85 uA.

Figure 5:
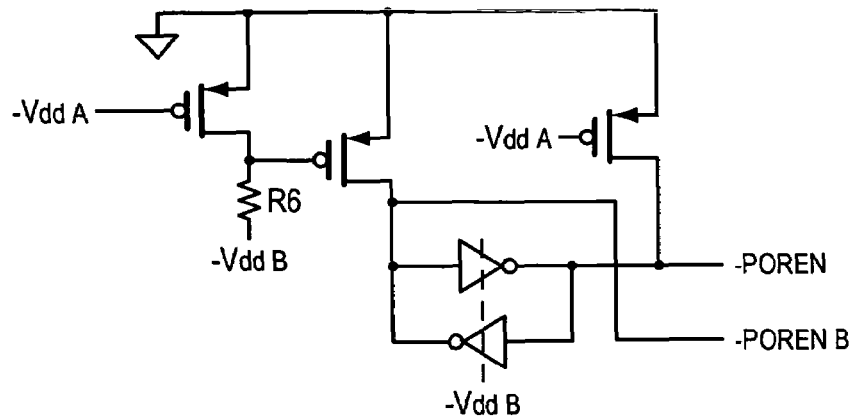
FIG. 5 is negative supply domain equivalent of the circuit of FIG. 4.

FIG. 5 is a dual of FIG. 4 except in the negative domain. Here p-type CMOS transistors are used rather than the n-types of FIG. 4. As known to those skilled in the art, other types of field effect transistors or, with a power dissipation penalty, bipolar transistors or combinations thereof may be used in the present invention.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A detection circuit for monitoring a first supply voltage level comprising:
    a voltage detection circuit having a first input operatively connected to the first supply voltage and a first output, wherein the voltage detection circuit is responsive to a first threshold,
    a current limiting load functionally connecting a second power supply to the first output,
    a voltage differencing circuit with one input operatively connected to the first output and a second input operatively connected to the first supply voltage, the voltage differencing circuit having a first difference output and a second difference output, the voltage differencing circuit responsive to a second threshold that is higher than the first threshold, the voltage differencing circuit powered from the second power supply,
    a latch circuit having a first latch input, a second latch input, a first latch output and a second latch output, wherein the first latch input is operatively connected to the first difference output and the second latch input operatively connected to the second difference output, wherein the latch circuit logic state is responsive to first and the second difference outputs, and wherein the latch logic state indicates that the first supply voltage is high enough to power a circuit when the first supply voltage exceeds the second, higher threshold, and wherein the latch logic state indicates the first supply voltage is not high enough to power a circuit when the first supply voltage falls below the first, lower threshold, the difference between the second and the first thresholds defining a hysteresis, and wherein the first latch output and the second latch output both are functionally connected to circuitry that is powered by the first power supply.

2. The circuit of claim 1 wherein the latch comprises cross coupled gates.

3. The circuit of claim 1 wherein the latch comprises cross coupled inverters, wherein the first latch input and the first latch output are one electrical connection, and wherein the second latch input and the second latch output are a second electrical connection, the latch having an internal drive that maintains the latch's logic state.

4. The circuit of claim 3 wherein the drive of the differencing circuits outputs is arranged to overcome the latch's internal drive and change the state of the latch.

5. The circuit of claim 1 further comprising a second current load on the differencing circuit from the second power supply, wherein the second current load partially determines the second threshold.

6. The detection circuit of claim 1 wherein the voltage detection circuit comprises a first field effect transistor that defines the first threshold, and wherein its gate is the first input, and its source is operatively connected to a current return.

7. The detection circuit of claim 6 wherein the voltage differencing circuit comprises:
    a second field effect transistor having its gate operatively connected to the drain of the first field effect transistor, its source operatively connected to the current return, and its drain forming the first difference output, and
    a third field effect transistor having its gate operatively connected to the first supply voltage, its source connected to a current return, and its drain forming the second difference output, the third field effect transistor defining the second threshold, wherein the third field effect transistor conducts when the first supply voltage is at or above the first voltage threshold.

8. The detection circuit of claim 7 wherein the latch circuit comprises cross coupled inverters wherein the first latch input and the first latch output are one electrical connections, and wherein the second latch input and the second latch output are one electrical connections, and wherein the low going drive of the second or the third field effect transistor overcome the drive of the inverters thereby changing the logic state of the latch.

9. The circuit of claim 6 wherein the field effect transistors are MOS n-types.

10. The circuit of claim 6 wherein the field effect transistors are MOS p-types.

11. A process for monitoring a first supply voltage level, wherein the process is carried out in monitoring circuitry, the process comprising the steps of:
    powering the monitoring circuitry from a second power supply;
    detecting when the first supply voltage has risen to a given threshold and presenting a first voltage output
    limiting the current from the second power supply to the first voltage output,
    differencing the first voltage output and the first supply voltage, wherein when the first supply voltage has risen to the given threshold a latch is set and when the first voltage output has fallen to a lower threshold, the latch is reset, the difference between the given and the lower thresholds defining a hysteresis,
    outputting first and second signals
    to circuitry that is powered by the first power supply, wherein the first and second signals indicate to the circuitry powered by the first power supply that the first power supply is or is not high enough to power succeeding circuitry.

* * * * *

UNITED STATES PATENT AND TRADEMARK OFFICE
CERTIFICATE OF CORRECTION

PATENT NO. : 7,378,886 B2  
APPLICATION NO. : 10/965300  
DATED : May 27, 2008  
INVENTOR(S) : Gregory A. Maher It is certified that error appears in the above-identified patent and that said Letters Patent is hereby corrected as shown below:

On the Title Page, Item (73)  
Please add Assignee as follows:

Assignee: Fairchild Semiconductor Corporation, 82 Running Hill Road, South Portland, Maine 04106

Signed and Sealed this

Seventh Day of October, 2008

JON W. DUDAS  
*Director of the United States Patent and Trademark Office*